July 12, 1966 M. J. MURRAY III 3,260,966

BIAS CONTROLLED AMPLITUDE MODULATOR

Filed Sept. 16, 1963

INVENTOR.
Michael James Murray III
BY
Hovey, Schmidt, Johnson & Hovey.
ATTORNEYS.

3,260,966
Patented July 12, 1966

3,260,966

BIAS CONTROLLED AMPLITUDE MODULATOR

Michael James Murray III, Tulsa, Okla., assignor to Midwestern Instruments, Inc., Tulsa, Okla., a corporation of Delaware Filed Sept. 16, 1963, Ser. No. 309,032
7 Claims. (Cl. 332—31)

This invention relates to amplitude modulation systems and, more specifically, to apparatus responsive to a modulating signal for controlling the D.C. operating voltages applied to an amplifier stage to thereby modulate the output of the stage.

It is the primary object of this invention to provide apparatus for amplitude modulating a carrier signal, such apparatus achieving this end by superimposing the modulating signal upon the carrier signal through means coupled with the circuitry of an amplifier stage having the carrier signal applied to the input thereof, the modulation being effected by providing means in said circuitry responsive to the instantaneous amplitude of the modulating signal for controlling the levels of the operating voltages supplied to the active electrical element of the stage. More specifically, the level of the operating voltage applied to the input of the amplifier stage (such input taking the form of the grid element of a vacuum tube or base element of a transistor when the former is operated in common cathode configuration or the latter in common emitter configuration) is varied in accordance with the instantaneous amplitude of the modulating signal by a variable impedance device whose impedance is responsive to said modulating signal.

It is another object of this invention to provide apparatus coupled with the bias circuitry of a transistor amplifier having a carrier signal applied to the input thereof, said apparatus including a variable impedance device whose impedance is responsive to a modulating signal applied thereto for varying the D.C. operating voltage applied to the input of the transistor, the impedance of said device having a value, when the amplitude of the modulating signal is zero, permitting the transistor to produce an output signal only during a predetermined portion of the carrier signal. Thus, variation in the impedance of the device when the modulating signal is applied thereto causes the amplitude reference axis of the output signal from the transistor to displace or vary in accordance with the amplitude of the modulating signal.

It is another object of this invention to provide apparatus for amplitude modulating a carrier signal applied to the input of an active electrical element such as a vacuum tube or a transistor, the production of an amplitude modulated output signal from the active element being accomplished by varying the D.C. operating voltage applied to the input thereof, the operating voltage being employed to control the operation of the element (such as, for example, the grid bias on a vacuum tube or the bias applied to the emitter-base junction of a transistor operated in common emitter configuration), such apparatus including a transistor coupled with the circuitry supplying the operating voltages to the active element. The impedance of one of the junctions of the transistor is rendered responsive to the application thereto of a modulating signal to vary the bias impressed across the junction to, in turn, control the impedance of the junction, whereby the level of the operating voltage applied to the input of the active element is varied in accordance with the changing of the impedance of the junction with the instantaneous amplitude of the modulating signal.

It is still another object of this invention to provide circuitry for supply operating voltages to an active electrical element, said circuitry including a voltage divider network having a pair of arms, one of the arms having a constant impedance, the other arm having a variable impedance device interposed therein whose impedance is responsive to the instantaneous amplitude of a modulating signal applied to the device, to the end that a carrier signal applied to the input of the active element is amplitude modulated by the modulating signal by the variation in the operating voltages supplied by the voltage divider to produce an output signal from the active element which has a time-varying carrier signal component having amplitude peaks defining a time-varying envelope corresponding to the wave form of the modulating signal.

It is yet another object of this invention to provide the apparatus as set forth in the last-mentioned object wherein said active element comprises a transistor and wherein the operating voltages supplied to the emitter, base and collector elements of the transistor, when the amplitude of the modulating signal is zero, have a value to maintain the transistor substantially in saturation whereby the output from the transistor is clipped such that the output signal will contain time-varying components of one polarity only.

Other objects will become apparent as the detailed description proceeds.

Figures 1, 2A, 2B, 3:
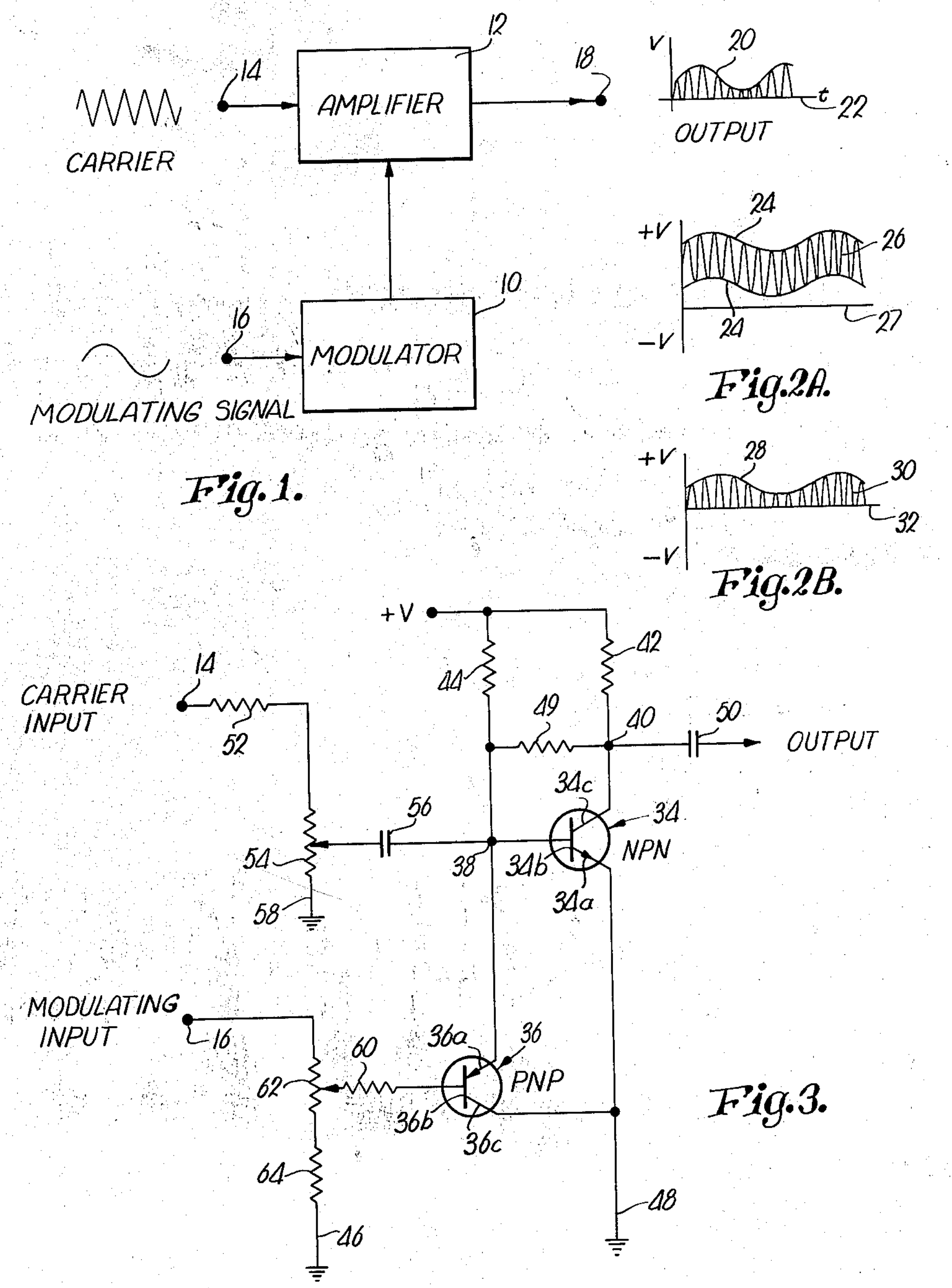
FIGURE 1 is a block diagram and graphic illustration of the operation of the modulation system of the present invention.
FIG. 2A is a graph showing the wave form of an undesired output signal produced by the invention.
FIG. 2B is a graph showing the wave form of the desired output signal produced by the invention.
FIG. 3 is a schematic circuit diagram showing the electrical components comprising the apparatus of the present invention.

FIGURE 1 shows a modulator 10 and an amplifier stage 12 in block diagram form. An electrical carrier signal is illustrated as being applied to a terminal 14. An electrical modulating signal is illustrated as being applied to a terminal 16. Both the carrier signal and the modulating signal are shown having time-varying wave forms provided with half-cycles of opposite polarity. The modulating signal is of a frequency lower than the frequency of the carrier signal in accordance with conventional modulation concepts.

It may be seen from FIG. 1 that the carrier signal is applied to the amplifier stage 12 simultaneously with the application of the modulating signal to the modulator 10 for the purpose of producing an output signal illustrated as appearing at terminal 18 and emanating from the output of the amplifier stage. At this point, it may be noted that the output signal shown in FIG. 1 contains a time-varying envelope 20 corresponding to the wave form of the modulating signal but, that the envelope 20 differs from the usual amplitude modulation envelope in that it appears on only one side of the amplitude reference axis 22. In other words, one-half of the output signal usually obtained from the process of amplitude modulation has been clipped by the apparatus of the present invention.

FIGS. 2A and 2B vividly illustrate the clipping action above referred to. In FIG. 2A it may be seen that a time-varying envelope 24 is shown enclosing a time-varying carrier signal 26. Both signals are of generally sinusoidal form, the envelope 24 corresponding to the wave form of the modulating signal. However, a composite signal such as represented by 24 and 26 would be useless in most applications, since the composite signal is entirely on the positive side of the amplitude reference axis 27 and the peak-to-peak amplitude of the carrier signal 26 remains unchanged.

Referring to FIG. 2B, an envelope 28 is shown defined by the amplitude peaks of a carrier signal 30. Unlike the signal shown in FIG. 2A, however, the composite signal including carrier 30 and envelope 28 is clipped by the amplitude reference axis 32 such that only the portions thereof of positive polarity remain. It should be understood that this clipping is actually accomplished by displacing the reference axis 27 from the position shown in FIG. 2A to provide a new reference axis 32 as shown in FIG. 2B. Therefore, the difference between the signals shown in FIG. 2A and shown in FIG. 2B is that in the latter figure, rectification of the signals has occurred. It may be appreciated that a useful output is thus obtained since the aforesaid constant peak-to-peak amplitude of the carrier is eliminated. Furthermore, such output presents the advantage that detection thereof by the apparatus receiving the output signal is materially simplified.

Reference is now made to FIG. 3 wherein the circuitry of the present invention is shown. The active elements of the circuit include an NPN transistor 34 having an emitter element 34*a*, a base element 34*b*, and a collector element 34*c*, and a PNP transistor 36 having an emitter element 36*a*, a base element 36*b*, and a collector element 36*c*. A direct current power source (not shown) furnishes the operating voltages for the transistors, the positive side of the source being represented by the lead labeled +V. The ground connections represent the negative electrical side of the power source and also form a terminal common to both the input terminal 38 and the output terminal 40 of transistor 34. Input terminal 38 is connected with base 34*b*, while output terminal 40 is connected with collector 34*c*. The bias for the collector is provided by a load resistor 42 connected in series with the +V lead and terminal 40. The bias for the base 34*b* is provided by a voltage divider network comprising the following circuit: From the +V lead, through resistor 44 to the input terminal 38, and through the internal structure of transistor 36 to ground connections 46 and 48. It may thus be appreciated that transistor 34 forms the active electrical element of a common emitter transistor amplifier, and that the base bias for base 34*b* is supplied by a voltage divider type bias network wherein one of the arms of the voltage divider includes the internal structure of transistor 36. Resistor 49 provides negative feedback stabilization.

It should be understood at this juncture that although transistor 34 and its associated circuitry as shown in FIG. 3 comprises a stage of amplification, an actual voltage, current, or power gain in such stage is not requisite to the operation of the instant invention. As will be hereinafter described, it is the function of transistor 34 and its associated circuitry to serve as a means whereby a modulating signal may be superimposed upon a carrier signal to produce an output signal such as illustrated in FIGS. 1 and 2B at the output terminal 40. The output appearing at terminal 40 may then be coupled by such means as a capacitor 50 to subsequent stages of amplification or to means for transmitting the output signal to its point of use. Capacitor 50 may be of a value so as to block the D.C. voltage appearing at terminal 40, but to permit the passage of the alternating or time-varying output signal.

The carrier signal may be applied to the input of transistor 34 by an RC coupling network composed of resistor 52, resistor 54 and capacitor 56. Resistor 54 is variable so that the amplitude of the carrier signal applied to terminal 14 may be adjusted. One end of resistor 54 is grounded as at 58; hence, the carrier signal is conducted through capacitor 56 and applied across the emitter-base junction of transistor 34.

An adjustable resistance network composed of resistor 60, variable resistor 62, and resistor 64 is utilized to couple the modulating signal appearing at terminal 16 with transistor 36. A circuit from base 36*b* through resistors 60, 62 and 64 to ground at 46 determines the amplitude of the modulating signal applied to base 36*b*. The amplitude of the modulating signal is controlled by adjusting resistor 62. The ratio of the ohmic value of resistor 64 to the value of resistor 60 and that portion of resistor 62 in series with resistors 60 and 64 should be selected such that transistor 36 will be made to operate as a linear element.

In the operation of the invention the biases for the emitter, base and collector elements of transistor 34 must be set at levels such that the operating point of the amplifier stage is near the saturation region of the output characteristics of the stage. This operating point is the quiescent operating point, i.e., the operating point of the amplifier stage of transistor 34 when neither the carrier nor the modulating signal is applied thereto. Depending upon the characteristic of the particular type of transistor used for transistor 34, the quiescent point may be set in or near the saturation region, the only requisite being that the transistor will be responsive to only one half-cycle of the incoming carrier signal when the amplitude of the modulating signal is zero.

Along with the values of the various resistors in the circuitry, the impedance of the emitter-base junction of transistor 36 must also be set at a value such that the positioning of the quiescent operating point of the amplifier stage will be as aforesaid. This may readily be effected by selecting a value of resistor 44 such that the ratios of the impedance values of the two arms of the voltage divider will be appropriate for the base 34*b* of the particular transistor 34 utilized.

Assuming first that no modulating signal is present, an incoming carrier signal appearing at input terminal 38 of transistor 34 will cause an output signal to be produced at output terminal 40 during the negative half-cycles of the carrier signal. The positive half-cycles of the carrier will not effect the production of an output signal at terminal 40 because of the positioning of the quiescent operating point of the amplifier at or near the saturation region.

Assuming now that a time-varying modulating signal is introduced to the resistor network connected to base 36*b* of transistor 36, it may be seen that the potential at base 36*b* will vary in accordance with the amplitude variations of the modulating signal. With the modulating signal removed, the resistance of the emitter-base junction of transistor 36 is of a relatively high value due to the junction being slightly reverse biased. This slight reverse biased condition is set by adjustment of resistor 62. However, when a modulating signal is present, the positive half-cycles of the signal will cause the emitter-base junction of transistor 36 to be further reverse biased, resulting in a higher junction resistance. This increased resistance will alter the ratios of the resistances in the two arms of the voltage divider and will cause a higher D.C. voltage to appear across the emitter-base junction of transistor 34. This places the quiescent operating point of transistor 34 further into the saturation region resulting in the reduction of the amplitude of the output wave form. Conversely, negative half-cycles of the incoming modulating signal will reduce the reverse bias across the emitter-base junction of transistor 36 and may forward bias the junction, resulting in a lowered junction resistance and a decrease in the D.C. voltage across the emitter-base junction of transistor 34. This reduction in the forward bias of the emitter junction of transistor 34 causes the transistor to turn off, resulting in an increased amplitude of the output signal.

From the foregoing it may be seen that the voltage divider action of resistance 44 and transistor 36 controls the operating voltages or biases applied to the elements of transistor 34 so as to effectively alter the quiescent operating point theerof in accordance with the instantaneous amplitude of the modulating signal. In this manner, the wave form such as illustrated in FIG. 2B is produced at the output of transistor 34.

Those skilled in the art will appreciate that the polarity of the power source may be reversed and a PNP transistor and an NPN transistor employed for transistors 34 and 36, respectively, without effecting the operation of the apparatus. Furthermore, in the circuit as shown in FIG. 3, an NPN transistor may be substituted for transistor 36 without materially changing the function of the circuitry. Such substitution will cause the positive half-cycles of the modulating signal to decrease the emitter junction resistance, thus increasing the amplitude of the output signal. Conversely, a negative going modulating signal will further reverse bias the emitter junction of transistor 36 and increase the junction resistance, thereby effecting a decrease in the amplitude of the output signal. This, of course, is the direct opposite of the operation of the apparatus when a PNP type transistor is employed for transistor 36 as shown in FIG. 3.

The modulation system above described is particularly applicable to servo amplifier applications. In such applications the carrier signal would generally be a medium to high frequency audio signal, while the modulating signal would be a low frequency audio signal or a slow changing direct current. Adjustment of the amplitude of the carrier and modulating signals by resistors 54 and 62, respectively, affords excellent operation of differential current servomechanisms. The carrier amplitude adjustment serves as a quiescent current control, and the amplitude of the modulating signal determines the differential current. Since the control of these two functions is entirely independent one from the other, this type of modulation is ideal for driving amplifiers for use with differential current devices. Furthermore, if a suitable carrier frequency is chosen, i.e., much higher than the response of the servomechanism, the coils in the servomechanism itself will serve as a detection system. This eliminates the need for additional detection circuitry, thus making A.C. servo amplifiers more feasible and cheaper.

Having thus described the invention, what is claimed as new and desired to be secured by Letters Patent is:

1. In combination with an active electrical element, circuitry coupled with said element for applying an operating voltage thereto, and means coupled with said element for applying an electrical carrier signal thereto, modulation apparatus including:

a variable impedance device whose impedance is responsive to an electrical modulating signal applied thereto;

means coupling said device with said circuitry to control said operating voltage, and thereby the output of said element; and means coupled with said device for applying said modulating signal thereto to control the impedance of the device, whereby to provide an output signal from said element having an amplitude responsive to changes in the amplitude of said modulating signal, said impedance having a value, when the amplitude of said modulating signal is zero, for rendering said element responsive to only a predetermined portion of said carrier signal, whereby said output signal has a time-varying component having amplitude peaks defining a time-varying envelope corresponding to the wave form of said modulating signal.

2. In combination with an active electrical element, circuitry coupled with said element for applying an operating voltage thereto, and means coupled with said element for applying an electrical carrier signal thereto, said carrier signal having half-cycles of opposite polarity, modulation apparatus including:

a variable impedance device whose impedance is responsive to the instantaneous amplitude of an electrical modulating signal applied thereto;

means coupling said device with said circuitry to control said operating voltage, and thereby the output of said element; and means coupled with said device for applying said modulating signal thereto to control the impedance of the device, said impedance having a value, when the amplitude of said modulating signal is zero, for permitting said element to produce an output signal only during substantially one of said half cycles, whereby variation in said impedance causes the amplitude reference axis of said output signal to vary in accordance with the amplitude of said modulating signal and the output signal has a time-varying carrier signal component having amplitude peaks defining a time-varying envelope corresponding to the wave form of said modulating signal.

3. The invention of claim 2, said element comprising a transistor, said impedance having a value, when the amplitude of said modulating signal is zero, for maintaining the transistor substantially in saturation.

4. In amplitude modulation apparatus:

a source of electrical power;

an active electrical element having an input terminal, an output terminal, and a terminal common to the input and the output terminals, said element including means for producing an output signal responsive to a carrier and a modulating signal applied to the input terminal;

means coupled with the input terminal for applying said carrier signal thereto, said carrier signal having half-cycles of opposite polarity;

circuit means coupling the element with the source for supplying operating voltages to the element, one of said voltages being applied to said input terminal;

a transistor having an emitter, a base, and a collector;

means coupled with said base for applying said modulating signal thereto to control the impedance of the emitter-base junction of the transistor; and means coupling the transistor with said circuit means and having means connecting the emitter to said input terminal and connecting the collector to said common terminal to control said one voltage, said impedance having a value, when the amplitude of said modulating signal is zero, for permitting the element to produce said output signal only during substantially one of said half-cycles, whereby the amplitude reference axis of the output signal displaces responsive to the instantaneous amplitude of the modulating signal to vary the amplitude peaks of the time-varying carrier signal component of the output signal to produce a time-varying envelope corresponding to the wave form of the modulating signal.

5. In amplitude modulation apparatus:

a source of electrical power;

a first transistor having an emitter element, a base element, and a collector element;

means coupled with said base and emitter elements for applying an electrical carrier signal thereto, said carrier signal having half-cycles of opposite polarity;

an impedance network coupling said elements with said source for supplying operating voltages to the first transistor, said network including a voltage divider having a pair of arms coupled with said base and emitter elements, one of said arms having a constant impedance;

a second transistor having an emitter element, a base element, and a collector element;

means coupled with the base element of said second transistor for applying a modulating signal thereto to control the impedance of the emitter-base junction of the second transistor; and means interposing said second transistor in the other arm of said voltage divider, the last-mentioned means coupling the emitter element of the second transistor with the base element of the first transistor and coupling the collector element of the second transistor with the emitter element of the first transistor, the impedance of said emitter-base junction having a value, when the amplitude of the modulating signal is zero, for maintaining the first transistor substantially in saturation, whereby the amplitude reference axis of the output signal from said first transistor is displaced responsive to the instantaneous amplitude of the modulating signal to vary the amplitude peaks of the time-varying carrier signal component of the output signal to produce a time-varying envelope corresponding to the wave form of the modulating signal.

6. In modulation apparatus:

electrical means constructed and arranged for operation as an active circuit element and for passing one halfcycle of an alternating current signal applied thereto, when said electrical means is supplied with an operating voltage of a predetermined level;

means presenting an alternating current, carrier signal;

means coupling said carrier signal presenting means with said electrical means for application of said carrier signal to said electrical means;

source means presenting a direct voltage;

means presenting a time-varying, modulating signal;

means intercoupling said source means and said modulating signal presenting means for providing an output voltage of level varying in correspondence with the instantaneous amplitude of said modulating signal, the level of said output voltage being substantially equal to said predetermined level when the instantaneous amplitude of said modulating signal is zero; and means coupling said intercoupling means with said electrical means for supplying said output voltage to said electrical means.

7. The invention of claim 6, said electrical means including a transistor, said intercoupling means providing said output voltage at magnitudes substantially in the saturation region of said transistor, whereby said transistor delivers a unidirectional signal at its output which is a rectified composite of said carrier signal and said modulating signal.

References Cited by the Examiner

UNITED STATES PATENTS

| | | | |
|---|---|---|---|
| 3,085,131 | 4/1963 | Diehl. | |
| 3,108,234 | 10/1963 | Burns | 332—31 |
| 3,170,126 | 2/1965 | Bento et al. | 332—52 X |

FOREIGN PATENTS

| | | | |
|---|---|---|---|
| 868,534 | 5/1961 | Great Britain. | |

ROY LAKE, *Primary Examiner.*

A. L. BRODY, *Examiner.*